United States Patent

Ong et al.

[11] Patent Number: 6,104,645
[45] Date of Patent: Aug. 15, 2000

[54] HIGH SPEED GLOBAL ROW REDUNDANCY SYSTEM

[75] Inventors: Adrian Ong; Paul S. Zagar, both of Boise, Id.

[73] Assignee: Micron Technology, Inc., Boise, Id.

[21] Appl. No.: 08/659,724

[22] Filed: Jun. 6, 1996

Related U.S. Application Data

[63] Continuation of application No. 08/315,154, Sep. 29, 1994, Pat. No. 5,528,539.

[51] Int. Cl.[7] .............................. G11C 7/00; G11C 29/00
[52] U.S. Cl. ................. 365/200; 365/225.7; 365/230.03; 365/230.06
[58] Field of Search ................................... 365/200, 201, 365/189.05; 326/13, 230.06

[56] References Cited

U.S. PATENT DOCUMENTS

| | | | |
|---|---|---|---|
| 5,034,925 | 7/1991 | Kato | 365/200 |
| 5,060,197 | 10/1991 | Park et al. | 365/200 |
| 5,168,468 | 12/1992 | Magome et al. | 365/200 |
| 5,262,994 | 11/1993 | McClure | 365/200 |
| 5,268,866 | 12/1993 | Feng et al. | 365/200 |
| 5,270,976 | 12/1993 | Tran | 365/200 |
| 5,287,310 | 2/1994 | Schreck et al. | 365/189.05 |
| 5,295,102 | 3/1994 | McClure | 365/200 |
| 5,325,334 | 6/1994 | Roh et al. | 365/201 |
| 5,349,556 | 9/1994 | Lee | 365/200 |
| 5,355,339 | 10/1994 | Oh et al. | 365/200 |
| 5,375,090 | 12/1994 | Yoshida | 365/200 |
| 5,379,259 | 1/1995 | Fujita | 365/230.03 |
| 5,387,823 | 2/1995 | Ashizawa | 365/200 |
| 5,396,124 | 3/1995 | Sawada et al. | 326/13 |
| 5,471,426 | 11/1995 | McClure | 365/200 |
| 5,487,039 | 1/1996 | Sukegawa | 365/200 |
| 5,508,963 | 4/1996 | Sawada et al. | 365/200 |
| 5,548,225 | 8/1996 | Rountree et al. | 326/13 |

FOREIGN PATENT DOCUMENTS 6-012891  1/1994  Japan.

OTHER PUBLICATIONS

Journal of IEEE International Solid State Circuit Conference 1990, pp. 232–233 and 303 Kalter et al.

*Primary Examiner*—Viet Q. Nguyen
*Attorney, Agent, or Firm*—Trask, Britt & Rossa

[57] ABSTRACT

A row repair system for replacing a defective primary memory row with a redundant memory row within an entire section of an integrated circuit memory chip. The system comprises a dedicated match circuit for each redundant row in a given section. The match circuit analyzes incoming address information to determine whether the address corresponds to a memory location in a specific defective row in any one of a number of sub-array blocks within the section. When such a critical address is detected, the match circuit activates circuitry which inhibits access to the defective row and enables access to its dedicated redundant row.

22 Claims, 4 Drawing Sheets

6,104,645

HIGH SPEED GLOBAL ROW REDUNDANCY SYSTEM

This is a continuation of application Ser. No. 08/315,154, filed Sep. 29, 1994, now issued as U.S. Pat. No. 5,528,539.

CROSS-REFERENCE TO RELATED APPLICATIONS

The present application is related to a co-pending application entitled "DYNAMIC RANDOM ACCESS MEMORY," filed Apr. 6, 1995, having Ser. No. 08/420,943, and assigned to Micron Technology, Inc., assignee of this application.

FIELD OF THE INVENTION

This invention relates to semiconductor integrated circuits (ICs), and more specifically, to systems for replacing defective addressable circuit areas with redundant circuit areas in memory micro-circuits such as dynamic random access memory (DRAM), static random access memory (SRAM) and erasable programmable read only memory (EPROM) chips.

BACKGROUND OF THE INVENTION

Semiconductor integrated circuits contain large numbers of electronic components such as diodes and transistors built on a single chip. Due to the microscopic scale of these circuits, they are susceptible to component defects caused by material impurities and fabrication hazards.

In order to circumvent this problem, chips are built with redundant components and/or circuits that can be switched-in in lieu of corresponding circuits found defective during testing or operation. Usually the switching-out of a defective component or circuit and the switching-in of a corresponding redundant element is accomplished by using program logic circuits which are activated by blowing certain fuse-type memory devices built into the chip circuitry. The blowing of the fuse-type memory devices is normally performed prior to packaging, burn-in and delivery. The number of redundant circuits is limited by the space available on the chip. Allocation of space is balanced between the competing goals of providing the maximum amount of primary circuitry, while maintaining adequate redundancy.

Memory chips are particularly well suited to benefit from redundancy systems since typical memory ICs comprise millions of equivalent memory cells. Each memory cell or bit can maintain a logical 1 or 0 value. The cells are divided into generally autonomous "sections" or memory "arrays". For example, in a typical 64 Mbit DRAM there are 8 sections of 8 megabits apiece.

Each section is further divided into "sub array blocks" (SAB's) and the associated support circuitry for designating and accessing the cells within each SAB. In keeping with our example, each section of a 64 Mbit DRAM contains 8 SABs having about one million memory cells apiece. The memory cells in each SAB are arranged into an array of rows and columns. A single row or column is referred to as an "element" in this specification. A number of elements may be grouped together to form a "bank" of elements.

Over the years, engineers have developed many ingenious redundancy schemes which more efficiently use the available space on an IC. One recent scheme described by Morgan (U.S. Pat. No. 5,281,868) makes use of the fact that fabrication defects typically corrupt physically adjacent memory locations. The scheme reduces the number of fuses required to replace two adjacent columns by using one set of column-determining fuses to address the defective primary column and an incrementor for addressing an adjacent column. A problem with this scheme is that sometimes only one column is defective. Thus more columns are switched-out than is necessary to circumvent the defect.

Another problem with current common redundancy systems is that redundant elements serving one SAB are not available for use by other SABs. Providing this capability using previous techniques would have resulted in a prohibitive number of interconnection lines and switches.

Because the redundant circuitry located on each SAB was only available to replace primary circuitry on that SAB, each SAB had to have an adequate number of redundant circuits available to replace the most probable number of defective primary circuits which may occur. However, often times, one SAB will have no defects, while another has more defects than can be replaced by its redundant circuitry. In the SAB with no defects, the redundant circuitry will be unused while still taking up valuable space. The SAB having too many defects may cause the entire chip to be scrapped.

It would be desirable therefore to have a system whereby a given redundant circuit could replace any one of a number of primary circuits located within the entire section of an integrated circuit without unduly increasing circuit size and complexity.

SUMMARY OF THE INVENTION

The principal and secondary objects of this invention are to effect a more efficient use of redundant circuits and reduce their number, and to provide a system whereby a redundant circuit element can replace a primary circuit element within an entire section of a particular integrated circuit chip. These and other objects are achieved by creating a dedicated match circuit for each redundant circuit element in a given section of an integrated circuit chip. The match circuit analyzes incoming address information to determine whether the address corresponds to a specific defective element in any one of a number of sub-array blocks within the section. When a critical address is detected, the match circuit activates circuitry which disables access to the defective element and enables access to its dedicated redundant element.

DESCRIPTION OF THE PREFERRED EMBODIMENT OF THE INVENTION

The preferred embodiment of the invention is described as applied to a 64 megabit DRAM integrated circuit chip having a typical row addressable architecture. This does not restrict application of the invention to other architectures or even other areas of electronics where primary and redundant circuitry is chiefly comprised of separately addressable equivalent circuit elements. In such a cases, various groupings such as sections, sub-array blocks, groups, elements, rows and columns may refer to various subgroupings of substantially similar circuitry.

Figure 1:
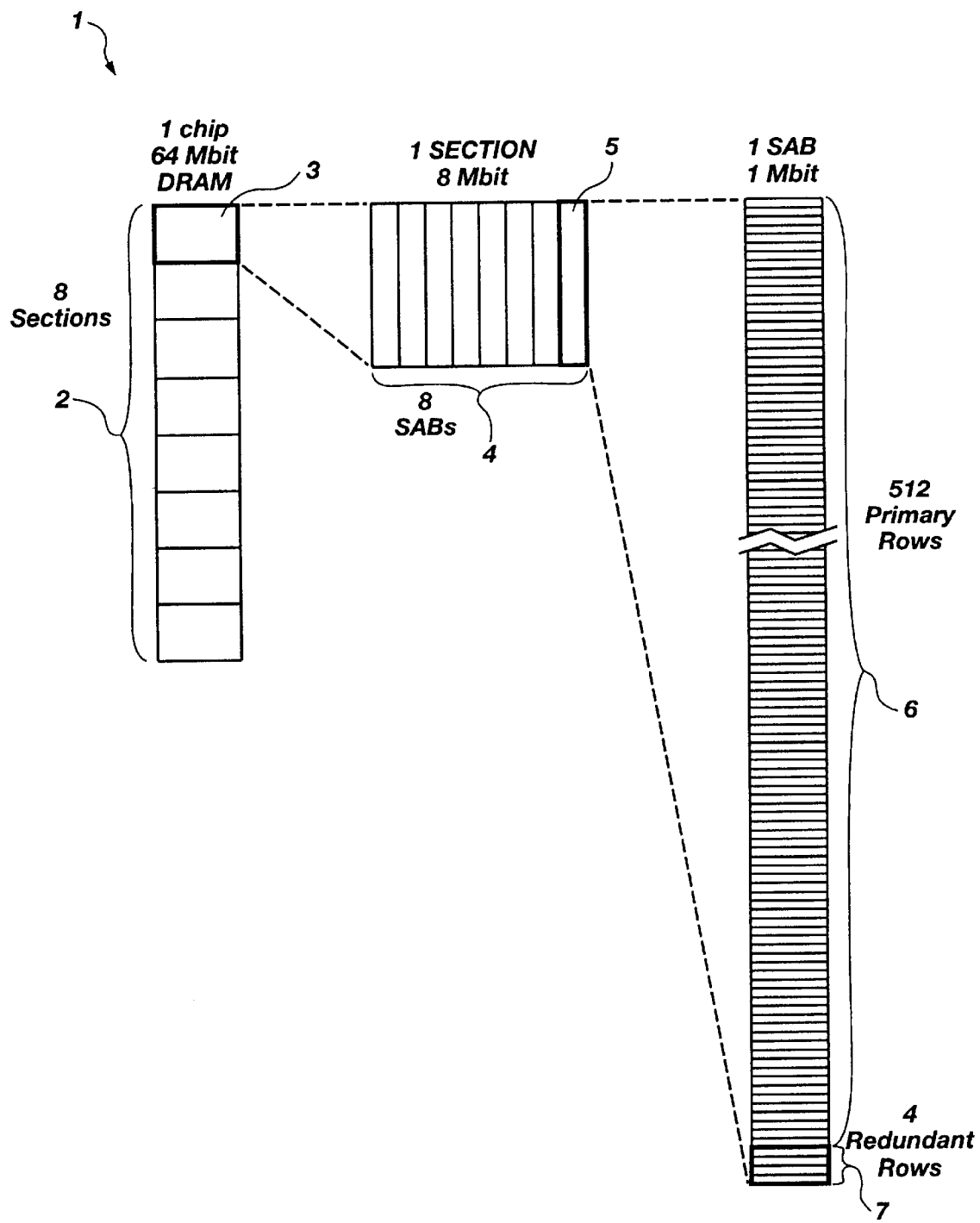
FIG. 1 is a block diagram of the memory layout of a typical 64 megabit DRAM integrated circuit.

Referring now to the drawing, there is shown in FIG. 1 a diagram of the available memory 1 in a typical 64 megabit DRAM memory chip such as those available from Micron Semiconductor, Incorporated of Boise, Id. The memory chip is divided into 8 separate sections 2 of 8 megabits of memory apiece. Each section 3 is further subdivided into 8 sub-array blocks 4. Each sub-array block 5 contains 512 contiguous primary rows 6 and 4 redundant rows 7 which are analogous to one another in operation. Each of the primary and redundant rows contains 2048 uniquely addressable memory cells. A twenty-four bit addressing scheme can uniquely access each memory cell within a section. Therefore, each primary row located in the eight SABs is uniquely addressable by the system. The rows are also referred to as circuit elements.

Figure 2:
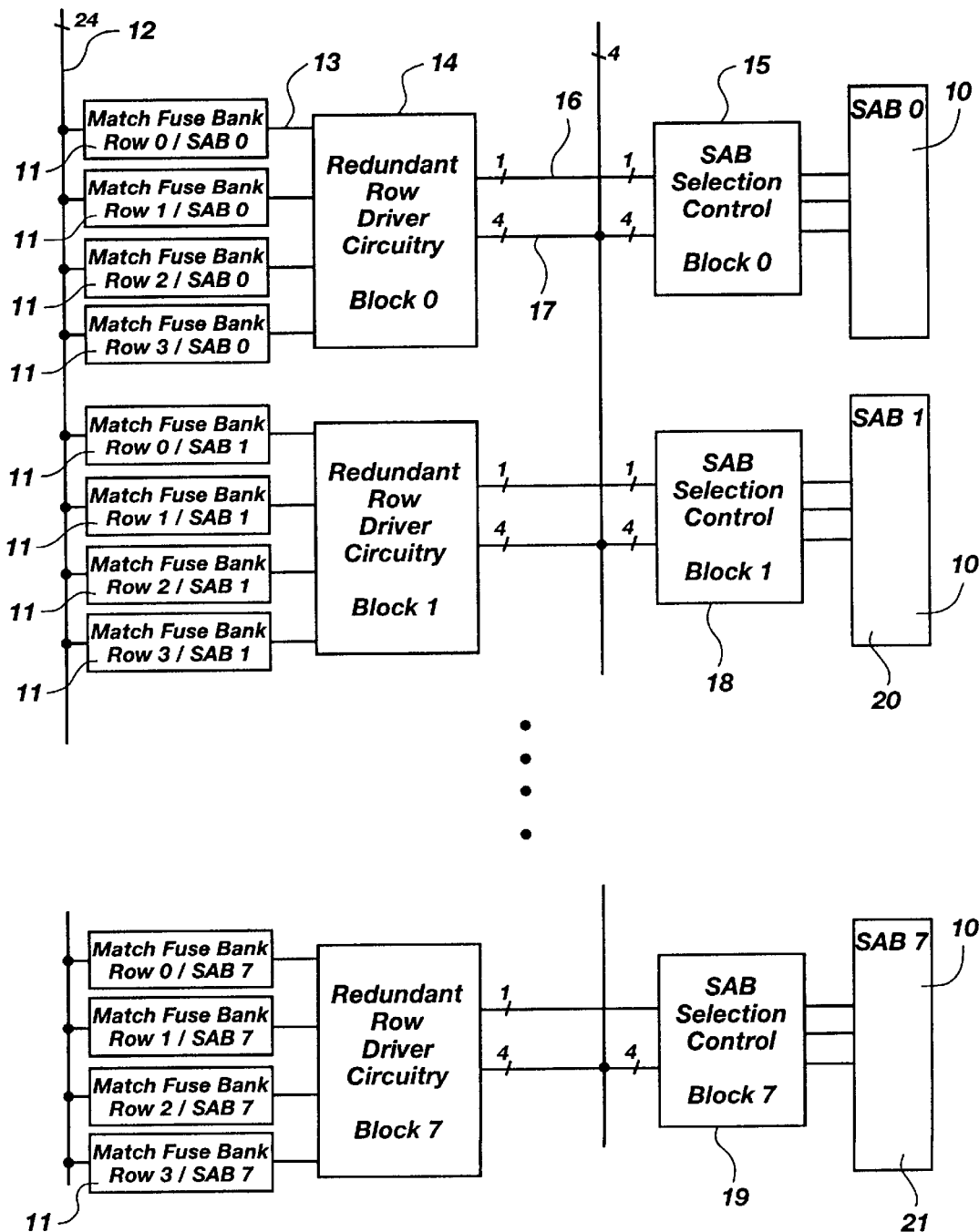
FIG. 2 is a block diagram of the universal repair system.

FIG. 2 shows a block diagram of the redundancy system according to the invention for a section of the 64Mbit DRAM IC. The memory in the section is divided into eight SABs 10 which are identified as SAB 0 through SAB 7. As described above, each SAB has 512 primary rows and 4 redundant rows. Each of the four redundant rows has a dedicated multi-bit comparison circuit module in the form of a match-fuse bank 11 which is capable of receiving an identifying multi-bit addressing signal in the form of a predecoded address. The match-fuse bank scrutinizes the received address and decides whether it corresponds to a memory location in a primary row which is to be replaced by the redundant row associated with the bank. It is apparent in this example that there are a total of 32 match-fuse banks for the 32 redundant rows existing in the entire section.

Address lines 12 carry a twenty-four bit primary memory addressing code to all of the match-fuse banks. Each bank comprises a set of fuses which have been selectively blown after testing to identify a specific defective primary row. When the address corresponding to a memory location in that defective row appears on address lines 12, the corresponding match-fuse bank sends a signal on an output line 13 toward the redundant row driver circuit 14. The redundant row driver circuitry then signals its associated SAB Selection control circuitry 15 through its redundant block enable line 16 that a redundant row in that SAB is to be accessed. The redundant row driver circuitry also signals which redundant row of the four available in the SAB is to be activated. This information is carried by the four redundant phase driver lines (REDPH1 through REDPH4) 17. The redundant phase driver lines are also interconnected with all of the other SAB Selection Control circuitry blocks 18, 19 which service the other SABs 20, 21. Whenever an activation signal appears on any one of the redundant phase driver lines 17, the SAB Selection Control blocks disable primary row operation in each of their dedicated SABs.

It is important to reiterate that the address which initially fired off the match fuse bank can correspond to a memory location anywhere in the section, in any one of the 8 SABs.

FIG. 2 simply shows how the various components interact for the purposes of the redundancy system. As a result, some lines such as those providing power and timing are not shown for the sake of clarity.

Figure 3:
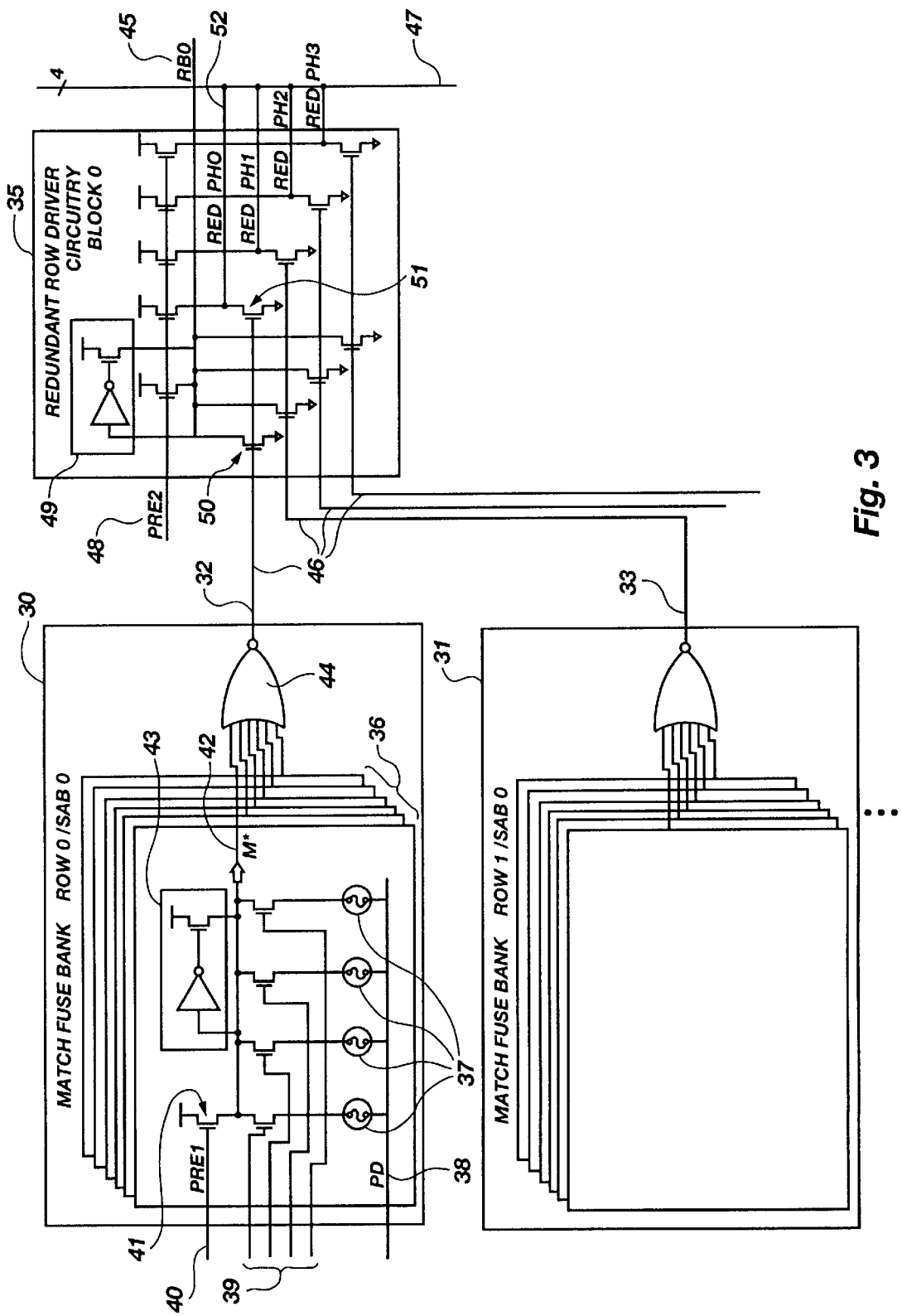
FIG. 3 is a circuit diagram of a match fuse bank and related redundant row driver circuit.

FIG. 3 shows in greater detail a portion of the components of FIG. 2. In general, FIG. 3 shows two match fuse banks 30 and 31 which are connected via output lines 32 and 33 to a redundant row driver circuit 35.

In order to describe the natures and functions of the components, let us assume that a particular primary row in sub-array block 5 were determined to be bad. To replace that defective row with a redundant row, we must first select an available redundant row. The redundant row in block 0, position 0 is determined to be available. We then set about blowing certain fuses in the match-fuse bank 30 dedicated to that chosen redundant row. Selectively blowing a certain combination of fuses will cause the match-fuse bank to fire upon the arrival of a twenty-four bit address corresponding to a memory location existing in the defective primary row of SAB 5. An address which causes detection by the match-fuse bank shall be called a "critical" address.

Each match fuse bank is divided into six sub-banks 36, each having four laser fuses 37. Laser fuses are preferred because they have been successfully implemented in the past, however, any state maintaining memory device may be used in the system. The twenty-four address lines are divided up so that four lines 39 go to each sub-bank. Each of the four address lines serving a sub-bank is wired to the gate of a transistor switch within the sub-bank.

In order to program the match-fuse bank to detect the critical address, three of the four laser fuses 37 existing on each sub-bank are blown leaving one fuse unblown. Each sub-bank therefore, has four possible programmed states. By combining six sub-banks, a match-fuse bank provides $4^6$ or 4096 possible programming combinations. This corresponds to the 4096 primary rows existing in a section.

Each match fuse bank further comprises an enable fuse (not shown) which determines the voltage on line PD 38. To activate the fuse bank, the enable fuse must be blown. This brings node PD which is normally at $V_{cc}$ to ground. Prior to the arrival of an address signal on the address lines 39, line PRE1 40 is held low to close a transistor switch 41 which allows node M* 42 to charge to $V_{cc}$. A keeper circuit 43 maintains the charge on node M* during any long periods of time between charging and arrival of the address signal.

When a critical address arrives via the address lines 39, a low appears on the line leading to the switch of the unblown fuse in each sub-bank. This closes the switch, thereby allowing node M* for each sub-bank to be brought to ground through the closed switch and the unblown fuse. Node M* 42 on each sub-bank supplies an input to a NOR gate 44. The output 32 of the NOR gate produces a logical high when all M* inputs are low during a match.

If the arriving address is not a match, the M* node on one or more of the sub-banks will remain high thereby keeping the output of the NOR gate low. The output of the NOR gate is connected the redundant row driver 35 for a particular SAB, in this case SAB 0.

Thus, the combination of the blown and un-blown states of these twenty-four fuses determines which primary row will be replaced by the redundant row dedicated to this bank. It shall be noted that this system can be adapted to other memory arrays comprising a larger number of primary circuit elements by changing the number of fuses in each sub-bank and changing the number of sub-banks in each match-fuse bank. Of course the specific design must take into account the layout of memory elements and the addressing scheme used. The circuit design of the sub-bank can-be changed accommodate different addressing schemes such that a match-fuse bank will fire only on the arrival of a specific address or addresses corresponding to other arrangements of memory elements, such as columns. Logic circuitry can be incorporated into the sub-bank circuitry to allow for more efficient use of the available fuses without departing from the invention.

The purpose of the redundant row driver is to inform its SAB that a redundant row is to be accessed, and which of the four redundant rows on the SAB is to be accessed. The driver also informs all the other SABs the redundant operation is in effect, disabling all primary rows. The redundant row driver uses means similar to the match fuse bank to detect a match. Information that a redundant row in SAB 0 is to be accessed is carried on line RB0 45 as a selection signal. RB0 attains a ground voltage when any of the four lines 46 arriving from the match fuse banks carries an activation voltage. Information concerning which of the four redundant rows in SAB 0 is to be accessed is carried on the four redundant phase driver lines 47 labeled REDPH0, REDPH1, REDPH2 and REDPH3. Since the redundant phase driver lines are common to all the SABs, these lines are used to inform all the SABs that primary row operation is to be disabled.

During an active cycle, when a potential matching address is to be scrutinized by the match fuse banks, RB0 and REDPH0–REDPH3 are precharged to $V_{cc}$ by PRE2 48 prior to the arrival of the address. RB0 is held at $V_{cc}$ by a keeper circuit 49. When Match Fuse Bank 0 has a match, its output 32 closes a transistor switch 50 which brings RB0 to ground. It also closes a transistor switch 51 dedicated to the first of the four redundant phase driver lines, REDPH0 52, since Match Fuse Bank 0 is in the first of four phase positions. REDPH1–REDPH3 remain however, at $V_{cc}$ since the other match fuse banks serving SAB 0 such as Match Fuse Bank 1 31 would not have been set to match on the current address.

The outputs of the redundant row drivers (RB0–RB7 and REDPH0–REDPH3) supply information to the SAB Selection Control circuitry for all the SABs. The job of each SAB Selection Control module is to simply generate signals which help guide its SAB operations with respect to its primary and redundant rows of memory. If primary row operation is called for, the module will generate signals which enable its SAB for primary row operations and enable the particular row phase-driver for the primary row designated by the incoming address. If redundant operation is called for, the module must generate signals which disable primary row operations, and if the redundant row to be used is within its SAB, enable its redundant row operations.

In other words, when memory is being accessed, each SAB can have six possible operating states depending on three factors: 1) whether or not the current operation is accessing a primary row or a redundant row somewhere in the entire section; 2) whether or not the address of the primary row is located within the SAB of interest; and 3) if a redundant row is to be accessed, whether or not the redundant row is located in the SAB of interest.

In the case where a primary row is being accessed, REDPH0–REDPH3 will be inactive, allowing for primary row designation. During redundant operation, one of REDPH0–REDPH3 will be active, disabling primary operation in all SABs and indicating the phase position of the redundant row. The status of a particular SABs RB line will signify whether or not the redundant row being accessed is located within that SAB.

Figure 4:
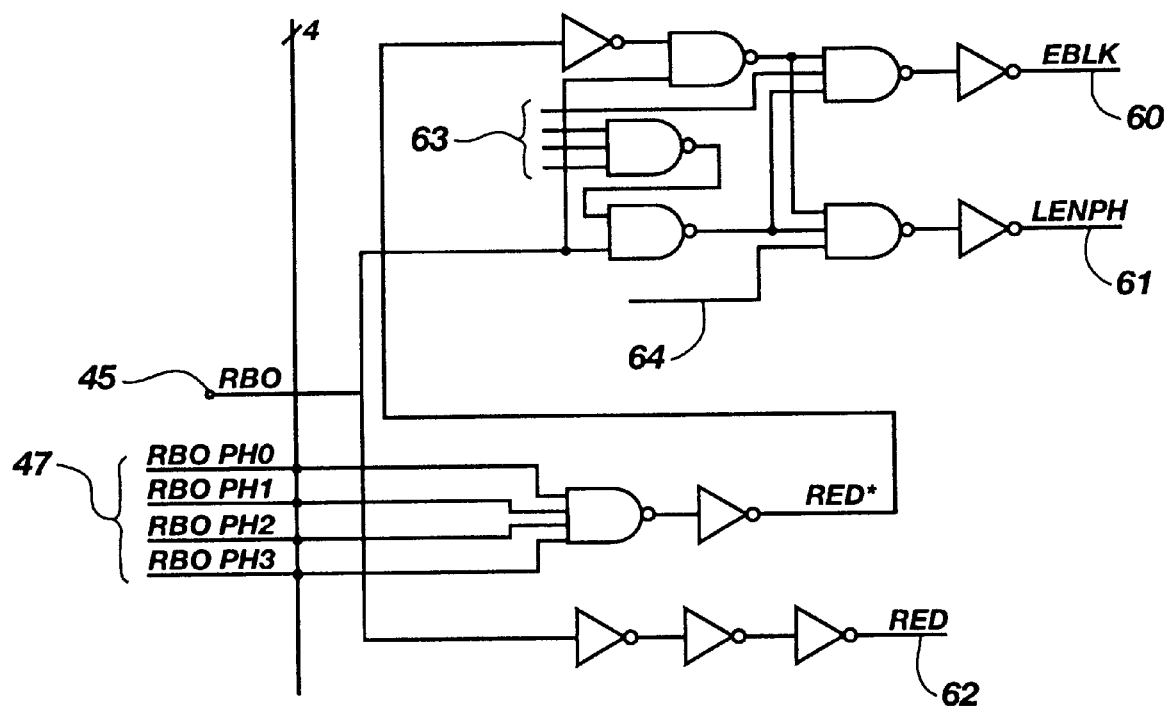
FIG. 4 is a circuit diagram of a sub-array block selection control circuit.

FIG. 4 shows a detailed circuit diagram for the preferred embodiment of one SAB Selection Control circuit. For consistency in our operational example, the SAB Selection Control circuit for SAB 0 is shown.

In order to set its dedicated SAB to the proper operational state, the SAB Selection Control circuit has three outputs. The first, EBLK 60, is active when the SAB is to access one of its rows, either primary or redundant. The second, LENPH 61, is active when the SAB phase drivers are to be used, either primary or redundant. The third, RED 62, is active when the SAB will be accessing one of its redundant rows.

The SAB Selection Control circuit is able to generate the proper output by utilizing the information arriving on several inputs. Primary row operation inputs 63 and 64 become active when an address corresponding to a primary row in SAB 0 is generated. When a redundant match occurs, redundant operation is controlled by redundant input lines RB0 45 and REDPH0–REDPH3 47.

Each of the above mentioned six operational cases for a given SAB will now be discussed in greater detail. During primary operation when the address does not correspond to a memory location in the SAB, none of the redundant input lines 45 and 47 and none of the primary operation input lines 63 and 64 are active.

During primary operation when the address does correspond to a memory location in the SAB, none of the redundant input lines are active. However, the primary operation lines 63 and 64 are active. This in turn activates EBLK and LENPH.

During redundant operation one of the redundant phase driver lines 47 will be active low. This logically results in outputs EBLK and LENPH being disabled. This can be overridden by an active signal arriving on RB0 45. Thus, all SABs are summarily disabled when a redundant phase driver line is active, signifying redundant operation. Only the SAB which contains the actual redundant row to be used is re-enabled through one of the redundant block enable lines RB0 through RB7.

Although FIG. 4 shows a specific logic circuit layout. Any layout which results in the following truth table would be adequate for implementing the system. The following is a truth table of SAB Selection Control inputs and outputs corresponding to the six possible operational states.

TABLE 1

| OPERATION TYPE | | | SAB0 SELECTION CONTROL | | | | | |
|---|---|---|---|---|---|---|---|---|
| | | | Input | | | Output | | |
| Primary Row to Fire? | Redundant Row In SAB0? | Primary Address In SAB0? | Primary Address Lines | One of $\overline{REDPH0}$–$\overline{REDPH3}$ | $\overline{RB0}$ | EBLK | LENPH | RED |
| yes | | yes | 1 | 1 | 1 | 1 | 1 | 0 |
| | | no | 0 | 1 | 1 | 0 | 0 | 0 |
| no | yes | yes | 1 | 0 | 0 | 1 | 1 | 1 |
| | | no | 0 | 0 | 0 | 1 | 1 | 1 |

TABLE 1-continued

<table>
<tr><th colspan="3">OPERATION TYPE</th><th colspan="2">SAB0<br>SELECTION CONTROL<br>Input</th><th colspan="4">Output</th></tr>
<tr><th>Primary Row to Fire?</th><th>Redundant Row In SAB0?</th><th>Primary Address In SAB0?</th><th>Primary Address Lines</th><th>One of REDPH0–REDPH3</th><th>RB0</th><th>EBLK</th><th>LENPH</th><th>RED</th></tr>
<tr><td></td><td>no</td><td>yes</td><td>1</td><td>0</td><td>1</td><td>0</td><td>0</td><td>0</td></tr>
<tr><td></td><td></td><td>no</td><td>0</td><td>0 or 1*</td><td>1</td><td>0</td><td>0</td><td>0</td></tr>
</table>

*Depending on whether redundant row in another SAB is to fire

The preferred embodiment describes the invention as implemented on a typical 64 Mbit DRAM where redundant circuit elements are replaced as rows. This is most convenient during "page mode" access of the array since all addresses arriving between precharge cycles correspond to a single row. However, the invention may be used to globally replace column type circuit elements so long as the match-fuse circuitry and the redundant driver circuitry is allowed to precharge prior to the arrival of an address to be matched.

The preferred embodiment realizes the inventive system through specific circuitry. However, this does not preclude the use of other circuitry, such as logical equivalents, to achieve the same purpose.

The main advantage of this invention is that it provides the ability to quickly and selectively replace a defective element in a section with any redundant element in that section.

The invention is readily adaptable to provide parallel redundancy between two or more sections during test mode address compression. In this way, one set of match-fuse banks would govern the replacement of a primary row with a specific redundant row in a first section and the same replacement in a second section. This allows for speedier testing and repair of the memory chip.

Another advantage is that existing redundancy schemes on current memory ICs can be upgraded without redesigning the architecture. Of course, this invention provides greater flexibility to subsequent memory array designs which may incorporate the invention at the design stage. In this case, modifications could provide for a separate redundancy bank which could provide circuits to replace primary circuitry in any SAB or any section. Likewise, a chip having only one section would allow for replacing any primary circuitry on the chip with equivalent redundant circuitry.

While the preferred embodiments of the invention have been described, modifications can be made and other embodiments may be devised without departing from the spirit of the invention and the scope of the appended claims.

What is claimed is:

1. In a memory device including a plurality of memory sub-arrays, each sub-array including a plurality of primary and redundant memory cells arranged in row and column groupings, a system for enabling one of the redundant memory cell groupings to be accessed in lieu of one of the primary memory cell groupings, the system comprising:

a plurality of banks of programmable elements, each bank being operatively associated with only one of the redundant memory cell groupings and being programmable to respond to receiving an address associated with a non-operative primary memory cell in any one of the sub-arrays by outputting a match signal corresponding to the redundant memory cell grouping operatively associated with the bank; and an enabling circuit coupled to each of the banks of programmable elements for receiving the match signal and, in response, enabling redundant memory operations in the redundant memory cell grouping that corresponds to the match signal and disabling primary memory operations in the primary memory cell grouping of the non-operative primary memory cell.

2. The system of claim 1 wherein the enabling circuit includes a plurality of redundant row drivers, each driver being associated with one of the sub-arrays and being coupled to at least one of the banks of programmable elements to receive a match signal therefrom and, in response, to output location signals corresponding to the redundant memory cell grouping associated with the received match signal.

3. The system of claim 1 wherein the programmable elements comprise fuses.

4. The system of claim 1 wherein the programmable elements comprise anti-fuses.

5. The system of claim 2 wherein the location signals comprise a sub-array selection signal and a redundant phase driver signal both.

6. The system of claim 2 wherein the enabling circuit further include a plurality of sub-array selection control circuits each associated with one of the sub-arrays, each control circuit responding to receiving location signals corresponding to a redundant memory cell grouping in its associated sub-array by outputting enabling signals to its associated sub-array to enable redundant memory operations therein, each control circuit responding to receiving location signals corresponding to a redundant memory cell grouping in another control circuit's associated sub-array by outputting disabling signals to its associated sub-array to disable primary memory operations therein.

7. The system of claim 6 wherein the enabling signals include a sub-array accessing enablement signal, a phase driver enabling signal, and a redundant operations enabling signal.

8. A memory device comprising:

a plurality of memory sub-arrays, each sub-array including a plurality of primary and redundant memory cells arranged in row and column groupings;

a plurality of banks of programmable elements, each bank being operatively associated with only one of the redundant memo cell groupings and being programmable to respond to receiving an address associated with a non-operative primary memory cell in any one of the sub-arrays by outputting a match signal corresponding to the redundant memory cell grouping operatively associated with the bank; and an enabling circuit coupled to each of the banks of programmable elements and the sub-arrays for receiving the match signal and, in response, enabling redundant memory operations in the redundant memory cell grouping that corresponds to the match signal and disabling primary memory operations in the primary memory cell grouping of the non-operative primary memory cell.

9. The memory device of claim 8 wherein the sub-arrays, the banks of programmable elements, and the enabling circuit share an integrated circuit die.

10. The memory device of claim 8 wherein the enabling circuit includes a plurality of redundant row drivers, each driver being associated with one of the sub-arrays and being coupled to at least one of the banks of programmable elements to receive a match signal therefrom and, in response, to output location signals corresponding to the redundant memory cell grouping associated with the received match signal.

11. The memory device of claim 8 wherein the programmable elements comprise fuses.

12. The memory device of claim 8 wherein the programmable elements comprise anti-fuses.

13. The memory device of claim 10 wherein the enabling circuit further includes a plurality of sub-array selection control circuits each associated with one of the sub-arrays, each control circuit responding to receiving location signals corresponding to a redundant memory cell grouping in its associated sub-array by outputting enabling signals to its associated sub-array to enable redundant memory operations therein, each control circuit responding to receiving location signals corresponding to a redundant memory cell grouping in another control circuit's associated sub-array by outputting disabling signals to its associated sub-array to disable primary memory operations therein.

14. A computer system comprising:

an input device;

an output device;

a processor coupled to the input and output devices; and a memory device coupled to the processor, the memory device comprising:

a plurality of memory sub-arrays, each sub-array including a plurality of primary and redundant memory cells arranged in row and column groupings;

a plurality of banks of programmable elements, each bank being operatively associated with only one of the redundant memory cell groupings and being programmable to respond to receiving an address associated with a non-operative primary memory cell in any one of the sub-arrays by outputting a match signal corresponding to the redundant memory cell grouping operatively associated with the bank; and an enabling circuit coupled to each of the banks of programmable elements and the sub-arrays for receiving the match signal and, in response, enabling redundant memory operations in the redundant memory cell grouping that corresponds to the match signal and disabling primary memory operations in the primary memory cell grouping of the non-operative primary memory cell.

15. The computer system of claim 14 wherein the sub-arrays, the banks of programmable elements, and the enabling circuit share an integrated circuit die.

16. The computer system of claim 14 wherein the enabling circuit includes a plurality of redundant row drivers, each driver being associated with one of the sub-arrays and being coupled to at least one of the banks of programmable elements to receive a match signal therefrom and, in response, to output location signals corresponding to the redundant memory cell grouping associated with the received match signal.

17. The computer system of claim 14 wherein the programmable elements comprise fuses.

18. The computer system of claim 14 wherein the programmable elements comprise anti-fuses.

19. The computer system of claim 16 wherein the enabling circuit further includes a plurality of sub-array selection control circuits each associated with one of the sub-arrays, each control circuit responding to receiving location signals corresponding to a redundant memory cell grouping in its associated sub-array by outputting enabling signals to its associated sub-array to enable redundant memory operations therein, each control circuit responding to receiving location signals corresponding to a redundant memory cell grouping in another control circuit's associated sub-array by outputting disabling signals to its associated sub-array to disable primary memory operations therein.

20. In a memory device including a plurality of memory sub-arrays, each sub-array including a plurality of primary and redundant memory cells arranged in row and column groupings, a method of enabling one of the redundant memory cell groupings to be accessed in lieu of one of the primary memory cell groupings, the method comprising:

selecting one of the redundant memory cell groupings in any one of the sub-arrays to be accessed in lieu of the primary memory cell grouping of a non-operative primary memory cell in one of the sub-arrays;

programming the memory device with an address associated with the non-operative primary memory cell;

receiving addresses from external circuitry;

comparing the received addresses to the programmed address;

when one of the received addresses matches the programmed address, outputting a signal identifying the redundant memory cell grouping that is to be accessed in lieu of the primary memory cell grouping of the non-operative primary memory cell; and in response to the match signal, disabling all primary memory operations in all of the sub-arrays and enabling redundant memory operations in the redundant memory cell grouping identified by the match signal.

21. The method of claim 20 wherein the step of programming the memory device includes blowing fuses.

22. The method of claim 20 wherein the step of programming the memory device includes blowing anti-fuses.

* * * * *

UNITED STATES PATENT AND TRADEMARK OFFICE
CERTIFICATE OF CORRECTION

PATENT NO. : 6,104,645
DATED : August 15, 2000
INVENTOR(S) : Adrian Ong and Paul S. Zagar It is certified that error appears in the above-identified patent and that said Letters Patent is hereby corrected as shown below:

Title page,
Item [56], References Cited, U.S. PATENT DOCUMENTS,
after "5,268,866" insert an asterisk -- * --;
after "5,270,976" insert an asterisk -- * --;
after "5,287,310" insert an asterisk -- * --;
after "5,379,259" insert an asterisk -- * --;
after "5,396,124" insert an asterisk -- * --;
after "5,471,426" insert an asterisk -- * --;
after "5,508,963" insert an asterisk -- * --;
after "5,548,225" insert an asterisk -- * --;
after "6-012891" insert an asterisk -- * --;
after the reference cited in "Other Publications" skip a line and insert -- *cited by examiner --.

Column 4,
Line 56, change "changed accommodate" to -- changed to accommodate --.

Column 6,
Lines 36 and 39, after "EBLK" insert -- 60 -- and after "LENPH" insert -- 61 --.

Column 8,
Line 28, change "includes" to -- includes: --.
Line 42, after "signal" insert a period -- . --.
Line 42, delete "both".
Line 44, change "include" to -- includes --.
Line 66, change "memo cell" to -- memory cell --.

Column 9,
Line 17, change "includes" to -- includes: --.

UNITED STATES PATENT AND TRADEMARK OFFICE
CERTIFICATE OF CORRECTION

PATENT NO. : 6,104,645
DATED : August 15, 2000
INVENTOR(S) : Adrian Ong and Paul S. Zagar It is certified that error appears in the above-identified patent and that said Letters Patent is hereby corrected as shown below:

Column 10,
Line 9, change "includes" to -- includes: --.
Line 51, change "a signal" to -- a match signal --.

Signed and Sealed this

Twenty-eighth Day of February, 2006

JON W. DUDAS
*Director of the United States Patent and Trademark Office*